United States Patent
Ishida et al.

(10) Patent No.: US 9,052,610 B2
(45) Date of Patent: Jun. 9, 2015

(54) COATING AND DEVELOPING SYSTEM AND COATING AND DEVELOPING METHOD

(75) Inventors: Seiki Ishida, Koshi (JP); Taro Yamamoto, Koshi (JP)

(73) Assignee: TOKYO ELECTRON LIMITED, Tokyo-To (JP)

(*) Notice: Subject to any disclaimer, the term of this patent is extended or adjusted under 35 U.S.C. 154(b) by 579 days.

(21) Appl. No.: 13/408,302

(22) Filed: Feb. 29, 2012

(65) Prior Publication Data

US 2012/0156626 A1 Jun. 21, 2012

Related U.S. Application Data

(62) Division of application No. 11/562,648, filed on Nov. 22, 2006, now Pat. No. 8,154,106.

(30) Foreign Application Priority Data

Nov. 29, 2005 (JP) ................... 2005-344071

(51) Int. Cl.
| | |
|---|---|
| H01L 21/311 | (2006.01) |
| H01L 21/31 | (2006.01) |
| H01L 21/469 | (2006.01) |
| G03C 5/00 | (2006.01) |
| G03F 7/20 | (2006.01) |
| H01L 21/02 | (2006.01) |

(52) U.S. Cl.
CPC ........ *G03F 7/70341* (2013.01); *H01L 21/0257* (2013.01); *G03F 7/70525* (2013.01); *G03F 7/70991* (2013.01)

(58) Field of Classification Search
CPC .............. H01L 21/02057; G03F 7/70341; G03F 7/70525; G03F 7/70091
USPC ................... 438/694, 781; 430/325
See application file for complete search history.

(56) References Cited

U.S. PATENT DOCUMENTS

| | | | |
|---|---|---|---|
| 6,984,477 B2 | 1/2006 | Ogata et al. | |
| 7,311,881 B2 | 12/2007 | Takenaka et al. | |
| 7,402,782 B2 | 7/2008 | Iwaki | |
| 7,736,558 B2 | 6/2010 | Yusa et al. | |
| 2001/0014224 A1 | 8/2001 | Hasebe et al. | |
| 2005/0205108 A1 | 9/2005 | Chang et al. | |
| 2006/0162646 A1 | 7/2006 | Akimoto et al. | |
| 2009/0004607 A1 | 1/2009 | Shimoaoki et al. | |
| 2009/0311632 A1* | 12/2009 | Takeguchi et al. | 430/322 |
| 2012/0015307 A1* | 1/2012 | Matsuoka et al. | 430/325 |

FOREIGN PATENT DOCUMENTS

JP   2005-175079   6/2005

* cited by examiner

*Primary Examiner* — David S Blum
(74) *Attorney, Agent, or Firm* — Oblon, McClelland, Maier & Neustadt, L.L.P.

(57) ABSTRACT

A coating and developing system for forming a resist film on a substrate by coating the substrate with a liquid resist and developing the resist film after the resist film has been processed by immersion exposure that forms a liquid layer on the surface of the substrate is capable of reducing difference in property among resist films formed on substrates. The coating and developing system includes: a cleaning unit; a carrying means; and a controller. A set time interval is determined such that the substrate is subjected to the immersion exposure process after contact angle drop rate at which contact angle between the cleaning liquid and a surface of the substrate drops has dropped from an initial level at the wetting time point when the surface of the substrate is wetted with the cleaning liquid to a level far lower than the initial level.

8 Claims, 10 Drawing Sheets

COATING AND DEVELOPING SYSTEM AND COATING AND DEVELOPING METHOD

CROSS REFERENCE

This application is a division of and is based upon and claims the benefit of priority under 35 U.S.C. §120 for U.S. Ser. No. 11/562,648, now U.S. Pat. No. 8,154,106, filed Nov. 22, 2006, the entire contents of which are incorporated herein by reference. U.S. Ser. No. 11/562,648 claims the benefit of priority under 35 U.S.C. §119 from Japanese Patent Application No. 2005-344071, filed Nov. 29, 2005.

BACKGROUND OF THE INVENTION

1. Field of the Invention

The present invention relates to a coating and developing system and a coating and developing method for coating a surface of a substrate with a liquid resist film and for processing the substrate coated with the resist film processed by an exposure process.

2. Description of the Related Art

Processes for fabricating a semiconductor device or a LCD include a process called photolithography for forming a resist pattern on a substrate. Photolithography includes a series of processes of forming a resist film by applying a liquid resist to a surface of a semiconductor wafer (hereinafter, referred to simply as "wafer"), exposing the resist film through a photomask, and developing the exposed resist film to form a desired resist pattern on the wafer.

An exposure method coats a surface of a substrate with a liquid film and exposes the surface through the liquid film (Patent document 1). This exposure method will be referred to as "immersion exposure method". An exposure system for carrying out the immersion exposure method will be briefly described with reference to FIG. 11. An exposure device 1 is disposed above a wafer W held in a horizontal position by a holding mechanism, not shown with a gap formed between the surface of the wafer W and the exposure device 1. The exposure device 1 is provided with a lens 10 on a central part of its lower end. A pouring opening 11 through which a liquid, such as pure water, is poured onto the surface of the wafer W and a suction hole 12 for recovering the pure water poured onto the surface of the wafer W are formed around the lens 10. Pure water is poured through the pouring opening 11 onto the surface of the wafer W and the pure water poured onto the surface of the wafer W is recovered through the suction hole 12 to form a liquid film (pure water film) in the gap between the lens 10 and the surface of the wafer W. A resist film formed on the surface of the wafer W is exposed to light emitted by a light source, not shown, and traveled through the lens 10 and the liquid film to transfer a predetermined resist pattern to the resist film.

Then, as shown in FIG. 12 by way of example, the exposure device 1 is moved horizontally with the liquid film formed between the lens 10 and the surface of the wafer W to position the exposure device 1 at the next transfer area (shot area) 13 and an exposure cycle for exposing the transfer area 13 to light is repeated to transfer the predetermined circuit pattern successively to shot areas 13 in the surface of the wafer W. In FIG. 12, the shot areas 13 are exaggerated.

Studies of forming a water-repellent protective film on a surface of a wafer W have been made to make a resist film difficult to remain on the surface of the wafer when the resist film is subjected to the immersion exposure process.

If the surface of a wafer W to be subjected to an immersion exposure process is contaminated with particles, the particles disperse in a liquid film formed for immersion exposure. If a resist film formed on the surface of the wafer W is exposed to light through the liquid film containing dispersed particles, a predetermined circuit pattern cannot be transferred to the resist film development defects are caused. Therefore, studies have been made to remove particles adhering to a surface coated with a protective film of a wafer W by cleaning the surface coated with the protective film with a cleaning liquid, such as pure water, before subjecting the wafer W to an immersion exposure process.

When pure water, namely, the cleaning liquid, wets and penetrates the protective film formed on the surface of the wafer W, a crosslinking agent, namely, a component of a solvent, contained in the resist film is eluted toward the protective film, and the protective film and the resist film merge together. The penetration degree (penetration distance I) at which pure water penetrates the protective film is expressed by Expression (1), namely, Lucas-Washburn formula.

$$I=(d \cdot y \cdot \cos \theta / 2\eta)^{1/2} \cdot t \qquad (1)$$

where d is the diameter of capillaries in the film, y is surface tension, $\theta$ is contact angle, $\eta$ is viscosity and t is time for which the liquid is in contact with the surface of the substrate.

Different wafers W having cleaned surfaces are kept for different times, respectively, before being carried into the exposure system and the contact angle $\theta$ changes with time after the protective film has been brought into contact with pure water. Therefore, the wafers W respectively having different contact angles $\theta$ are processed by immersion exposure. Once the protective film is wetted with pure water, this phenomenon occurs also after the pure water wetting the wafer has been removed. It is known from Expression (1) that pure water penetrates protective films at different degrees of penetration if the protective films of the different wafers W have different contact angles, respectively, and hence the respective properties of the resist films of the wafers W change differently. Consequently, patterns formed by development on the wafers W have lines of different widths, respectively. The same problem arises when a water-repellent protective film and a resist film are not formed on a surface of a wafer W and a water-repellent resist film is formed on the surface of the wafer W and the surface of the resist film is cleaned with a cleaning liquid.

Patent document 1: JP-A 2005-175079

SUMMARY OF THE INVENTION

The present invention has been made under such circumstances and it is therefore an object of the present invention to provide techniques capable of reducing difference in property among resist films formed on substrates for a coating and developing system that forms a resist film on a substrate and processes the resist film by a developing process after the resist film has been processed by immersion exposure.

The present invention provides a coating and developing system that forms a resist film on a substrate and processes the resist film by a developing process after the resist film has been processed by immersion exposure including:

a cleaning unit for cleaning a surface of a substrate coated with a resist film;

a carrying means for taking out the substrate from the cleaning unit and carrying the substrate to an exposure system that carries out an immersion exposure process; and a controller for controlling the carrying means such that a time interval between a wetting time point when the surface of the substrate is wetted with the cleaning liquid by the cleaning unit and a delivery time point when the substrate is delivered to the exposure system is equal to a set time interval;

wherein the set time interval is determined such that the substrate is subjected to the immersion exposure process after contact angle drop rate at which the contact angle between the cleaning liquid and a surface of the substrate drops has dropped from an initial level at the wetting time point when the surface of the substrate is wetted with the cleaning liquid to a level far lower than the initial level.

Suppose the relation between time and contact angle shown is represented by a curve shown in a graph in which time elapses from a wetting time point when the surface of the substrate is wetted with the cleaning liquid is measured on a horizontal axis and the contact angle between the surface of the substrate and the cleaning liquid is measured on the vertical axis. Then the contact angle decreases at a high drop rate with time at an initial stage and the derivative of the curve gradually approaches zero with time. The set time interval may in a time range in which the derivative of the curve is nearly equal to zero or a time interval between the wetting time point when the surface of the substrate is wetted with the cleaning liquid and a time point when the gradient of the curve starts decreasing in that time range.

The coating and developing system may be provided with a buffer unit disposed in a carrying passage between the cleaning unit and the exposure system to hold the substrate for time adjustment so that the substrate may be carried by the carrying means to the exposure system after the elapse of the set time interval from the wetting time point when the substrate is wetted with the cleaning liquid. Upon the reception of a substrate delivery command from the exposure system, the controller controls the carrying means so as to carry the substrate immediately to the exposure system when a time for which the substrate has been held after wetting the substrate with the cleaning liquid is longer than the set time interval or so as to hold the substrate in the buffer unit when a time for which the substrate has been held after wetting the substrate with the cleaning liquid is shorter than the set time interval.

The coating and developing system may include a protective film forming unit for forming a water-repellent protective film for protecting the surface of the substrate in the immersion exposure process, and the cleaning unit may clean the surface of the protective film. The coating and developing system may include a heating unit for processing the substrate by a heating process after a chemical solution has been applied to the substrate by the protective film forming unit, a carrying means for carrying the substrate processed by the heating process by the heating unit to the cleaning unit, and a controller that carries out a control operation to adjust a time interval between the completion of the heating process for heating the substrate by the heating unit and the start of cleaning the substrate by the cleaning unit to the predetermined set time interval.

The coating and developing system may include a buffer unit disposed in a carrying passage between the heating unit and the cleaning unit, and the controller may control the carrying means to adjust a time interval between the completion of the heating process and the start of the cleaning process by holding the substrate in the buffer unit.

A coating and developing method according to the present invention for coating a surface of a substrate with a resist film by applying a liquid resist to the surface of the substrate and processing the substrate by a developing process after the substrate has been processed by an immersion exposure process includes the steps of:

forming a resist film on a surface of a substrate;

cleaning the surface of the substrate with a cleaning liquid;

carrying the cleaned substrate to an exposure system by a carrying means to process the substrate by an immersion exposure process; and controlling the carrying means to adjust a time interval between a wetting time point when the surface of the substrate is wetted with the cleaning liquid and a delivery time point when the substrate is delivered to an exposure system to a set time interval;

wherein the set time interval is determined beforehand such that the substrate is subjected to the immersion exposure process after contact angle drop rate at which contact angle between the surface of the substrate and the cleaning liquid decreases has dropped from an initial level at a wetting time point when the surface of the substrate is wetted with the cleaning liquid to a level far lower than the initial level.

Desirably, a contact angle drop rate in the time range in which the level of the contact angle drop rate is far lower than that of the contact angle drop rate immediately after the surface of the substrate has been wetted with the cleaning liquid is one-third of the contact angle drop rate at which the contact angle decreases at the stage immediately after the surface of the wafer has been wetted with the cleaning liquid.

The present invention manages the time interval between the completion of cleaning the substrate and the start of the immersion exposure process in the foregoing manner. Therefore, the substrates are substantially the same in contact angle between the liquid for immersion exposure and the surface of the substrate even if times for which the substrates are held, respectively, after being cleaned before being subjected to the immersion exposure process. Thus the water-repellent protective films or the resist films formed respectively on the surfaces of the substrates are permeated with the liquid at equal degrees, respectively. Consequently, the properties of the surfaces of the substrates change at the substantially the same degree and hence the difference in the width of lines of a resist pattern among the substrates can be reduced.

The time interval between the completion of the heating process for heating the substrate coated with the chemical solution for forming the protective film or the liquid resist for forming the resist film and the start of the cleaning process for cleaning the substrate prior to subjecting the substrate to the immersion exposure process is adjusted to a predetermined set time interval. Therefore, the substrates are the same in the amount of moisture absorbed from the environmental atmosphere, and hence difference in the property of the surface of the substrate due to difference in moisture content among the substrates can be reduced.

DESCRIPTION OF THE PREFERRED EMBODIMENTS

Figure 1:
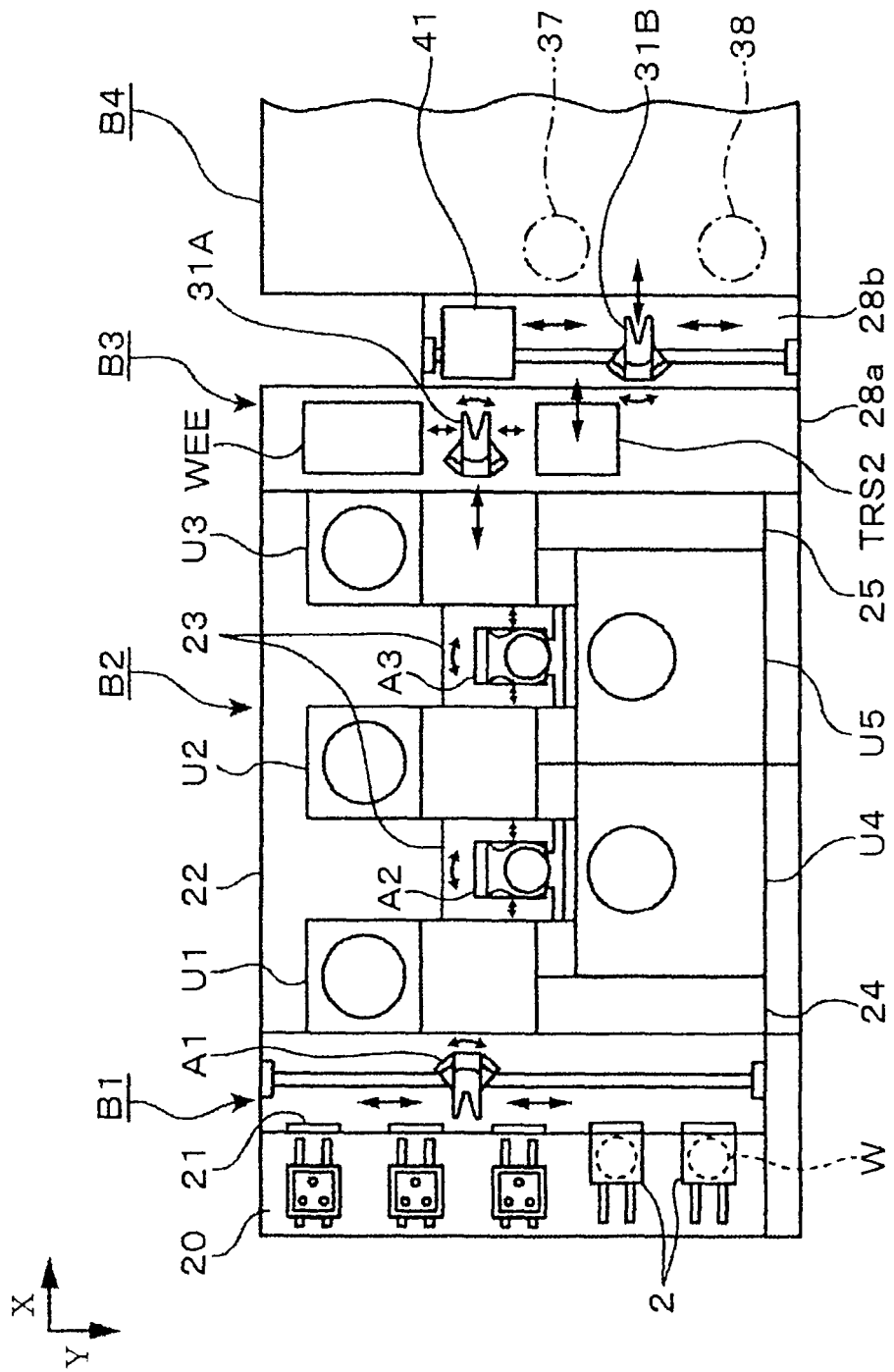
FIG. 1 is a plan view of a coating and developing system in a preferred embodiment according to the present invention.
Figure 2:
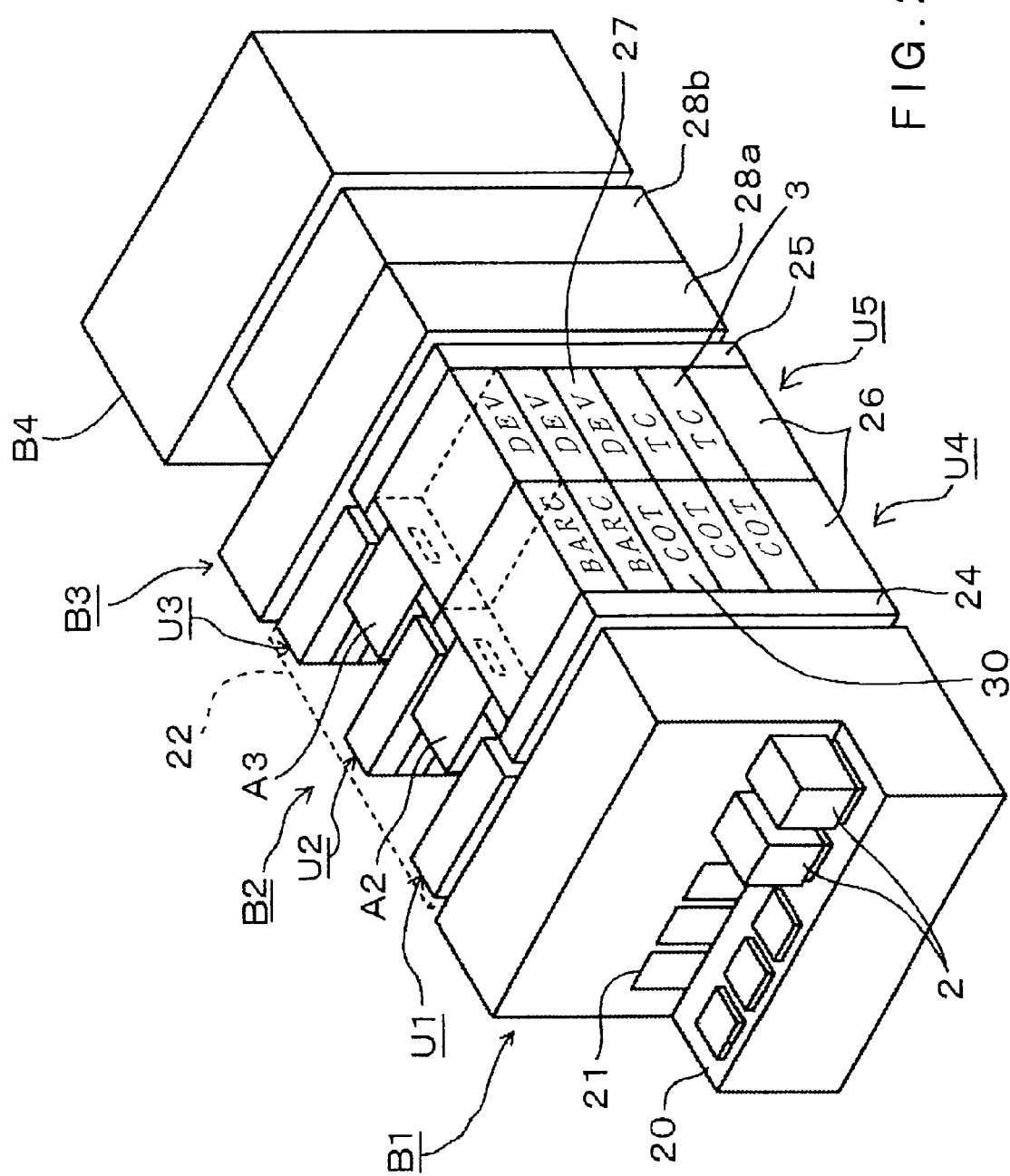
FIG. 2 is a perspective view of the coating and developing system embodying the present invention.

A system formed by connecting an exposure system to a coating and developing system in a preferred embodiment according to the present invention will be described with reference to FIGS. 1 and 2. Referring to FIGS. 1 and 2, an airtight carrier 2 containing, for example, thirteen wafers W is delivered to and sent out from a carrier station B1. The carrier station B1 has a carrier holding unit 20 capable of holding a plurality of carriers 2 in an arrangement, closable openings 21 formed in a wall behind the cassette holding unit 20, and a transfer device A1, namely, a transfer means, for taking out a wafer W from the carrier 2 through the closable opening 21.

A processing block B2 surrounded by a box 22 is disposed behind and connected to the carrier station B1. The processing block B2 includes shelf units U1, U2 and U3 each including heating/cooling units stacked in layers arranged in that order, wet processing units U4 and U5 arranged in that order, and main carrying devices A2 and A3. The shelf units U1, U2 and U3 and the main carrying devices A2 and A3 are arranged alternately. The main carrying devices A2 and A3 carries a wafer W from one to another of the shelf units U1, U2 and U3 and the processing units U4 and U5. Each of the main carrying devices A2 and A3 is disposed in a space 23 surrounded by side walls of the adjacent ones of the shelf units U1, U2 and U3, a side wall of each of the wet processing units U4 and U5 and a back wall on the left-hand side with respect to a longitudinal direction. Indicated at 24 and 25 in FIGS. 1 and 2 are temperature and humidity regulating units including temperature regulating devices for regulating the temperatures of processing liquids to be used by those units, ducts for temperature and moisture regulation and such.

Referring to FIG. 2, The wet processing unit U4 is built by stacking up coating units (COT) 30 for coating a surface of a wafer W with a film of a liquid resist and antireflection film forming units (BARC) in, for example, five layers on a chemical solution container 26, and the wet processing unit U5 is built by stacking up protective film forming units (TC) 3 for forming a water-repellent protective film on a surface of a wafer W, and developing units (DEV) 27 for wetting a surface of a wafer W with a developer in, for example, five layers on a chemical solution container 26. Each of the shelf units U1, U2 and U3 is built by stacking up various processing units for processing a wafer W by a pretreatment process before the wafer W is processed by a process to be carried out by each of the wet processing units U4 and U5 and by a post-treatment process after the wafer W has been processed by a process by each of the wet processing units U4 and U5 in, for example, ten layers. The processing units of each of the processing units U4 and U5 are heating units for heating (baking) a wafer W and cooling units for cooling a wafer W.

Figure 3:
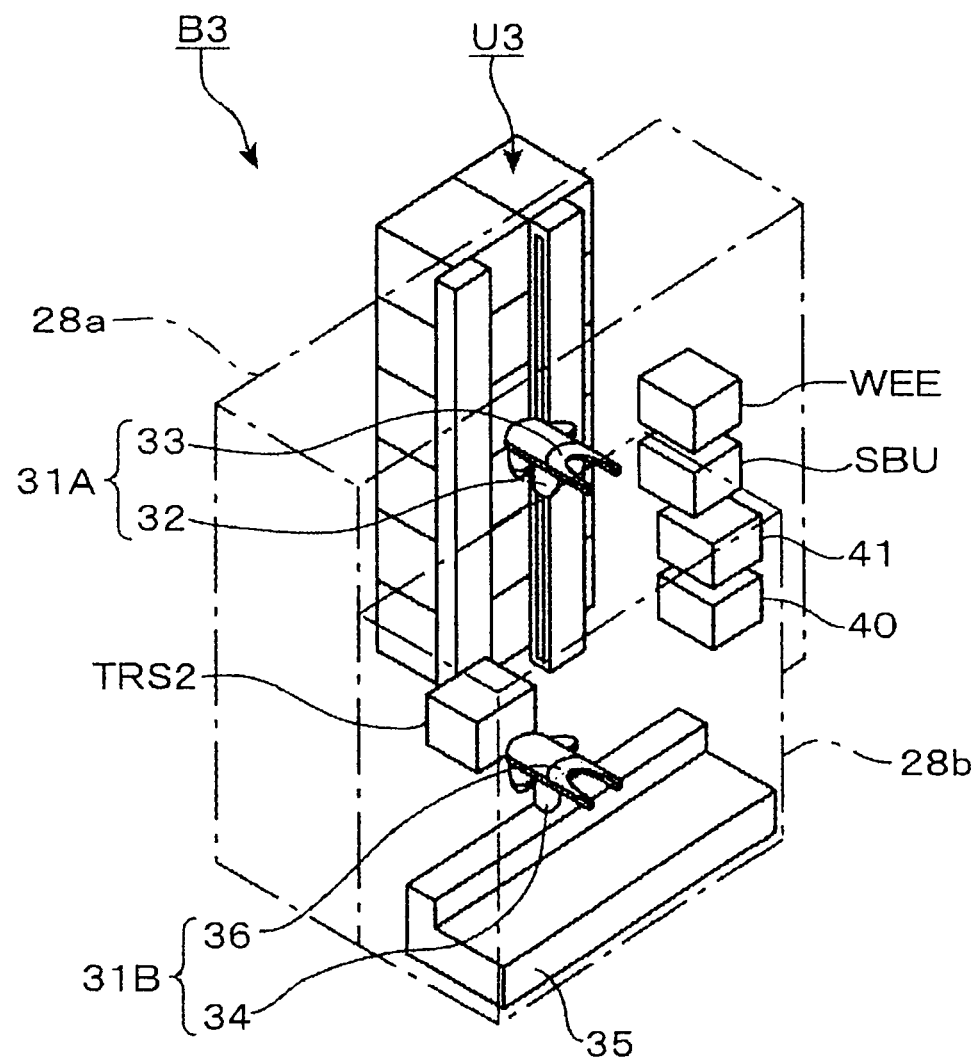
FIG. 3 is a schematic perspective view of an interface block included in the coating and developing system embodying the present invention.

An exposure system B4 is connected to the back end of the shelf unit U3 of the processing block B2 by an interface block B3. The interface unit B3 will be described with reference to FIGS. 1, 2 and 3. The interface block B3 has a first carrying chamber 28*a* and a second carrying chamber 28*b* arranged in a longitudinal arrangement between the processing block B2 and the exposure system B4. A main carrying device 31A and an auxiliary carrying device 31B are disposed in the first carrying chamber 28*a* and the second carrying chamber 28B, respectively. The main carrying device 31A and the auxiliary carrying device 31B are substrate carrying means. The main carrying device 31A has a base 32 capable of moving in vertical directions and of turning about a vertical axis, and an arm 33 mounted on the base 32 for forward and backward movement. A peripheral exposure unit WEE for selectively exposing only a peripheral part of a wafer W and a buffer cassette SBU for temporarily holding, for example, twenty-five wafers W are disposed on the left-hand side, as viewed from the carrier station B1, of the main carrying device 31A. A transfer unit TRS2 is disposed on the right-hand side, as viewed from the carrier station B1, of the main carrying device 31A in the first carrying chamber 28*a*.

Figure 4:
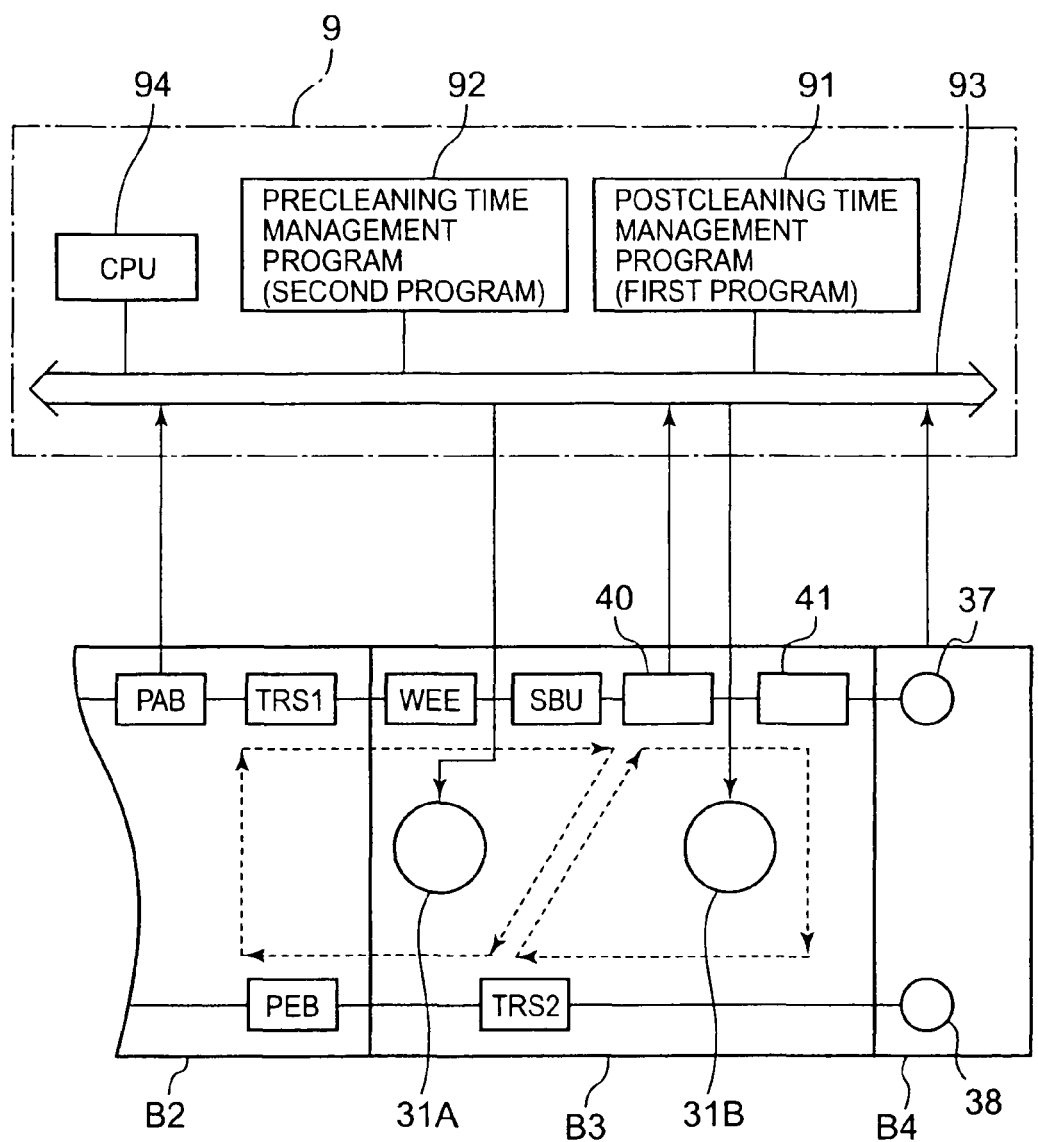
FIG. 4 is a plan view of a wafer carrying passage included in the coating and developing system embodying the present invention.

As shown in FIG. 4, the main carrying device 31A carries a wafer W not yet processed by an exposure process sequentially to the peripheral exposure unit WEE, the buffer cassette SBU and a cleaning unit 40. The main carrying device 31A carries a wafer W processed by the exposure process and delivered to the transfer unit TRS2 by the auxiliary carrying device 31B to a heating unit PEB.

The auxiliary carrying device 31B has a base 34 capable of moving in vertical directions and of turning about a vertical axis, a guide mechanism for transversely moving the base 34, and an arm 36 mounted on the base 34 for forward and backward movement. The cleaning unit 40 for cleaning a wafer W before the wafer W is subjected to an immersion exposure process, and a buffer unit 41 for temporarily holding a wafer cleaned by the cleaning unit 40 are disposed on the left-hand side, as viewed from the carrier station B1, of the auxiliary carrying device 31B in the second carrying chamber 28*b*. The buffer unit 41 overlies the cleaning unit 40. As shown in FIG. 4, the auxiliary carrying device 31B carries a wafer W from the cleaning unit 40 sequentially to the buffer unit 41 and a reception stage 37 included in the exposure system B4, and carries a wafer W from a delivery stage 38 included in the exposure system B4 to the transfer unit TRS2. Operations of the main carrying device 31A and the auxiliary carrying device 31B are controlled on the basis of instructions provided by a controller 9.

The construction of the cleaning unit 40 will be briefly described with reference to FIG. 5A. A spin chuck 50, namely, a substrate holding device, holds a wafer W in a horizontal position by suction. The spin chuck 50 can be driven for rotation about a vertical axis and vertical movement by a driving device 51. A cup 52 is disposed so as to surround the circumference of the spin chuck 50. A draining unit including a discharge pipe 53 and a drain pipe 54 is formed on the bottom wall of the cup 52.

Figure 5A:
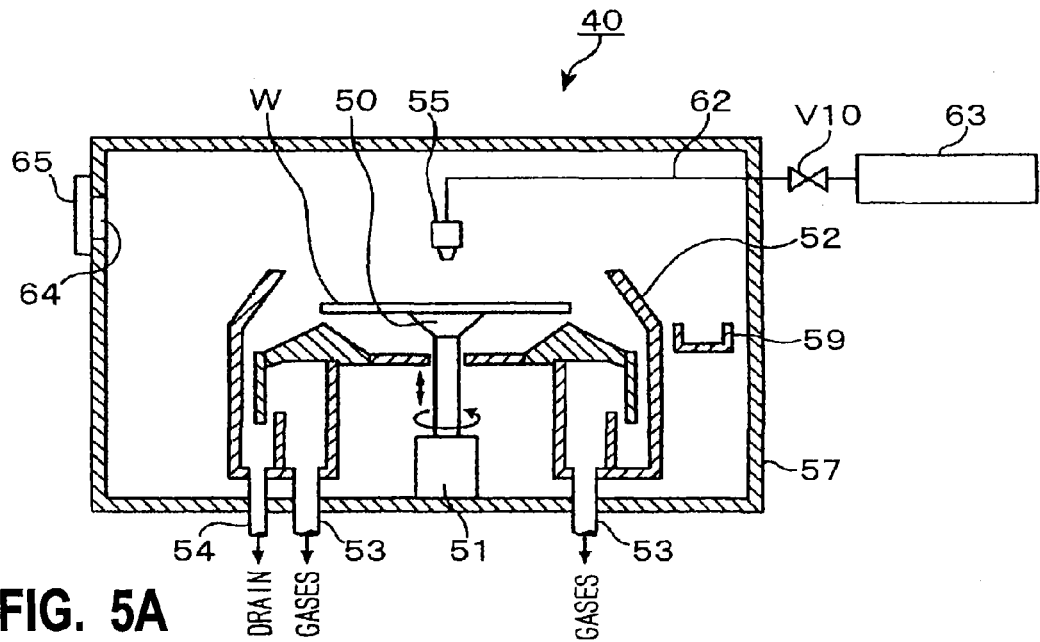
FIGS. 5(A) and 5(B) are a schematic sectional view and a schematic front elevation, respectively, of a cleaning device installed in the interface block.
Figure 5B:
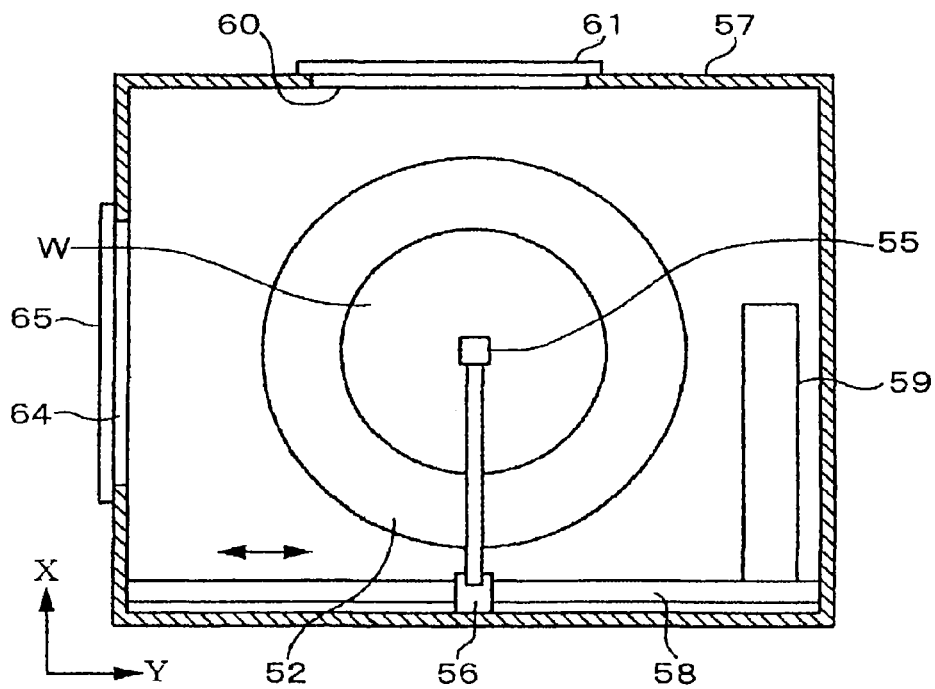

Indicated at 55 in FIGS. 5A and 5B is a cleaning liquid pouring nozzle for pouring a cleaning liquid onto a central part of the wafer W. The cleaning liquid pouring nozzle 55 can be horizontally moved along a guide rail 58 extended parallel to the length of a processing vessel 57, i.e., parallel to the Y-axis, between a home position 59 outside one end of the cup 52 and a pouring position substantially corresponding to the center of the wafer W and can be vertically moved by a moving mechanism 56. The cleaning liquid pouring nozzle 55 is connected to a cleaning liquid supply unit 63 for supplying a cleaning liquid, such as pure water, by a supply line 62. The supply line 62 is provided with a valve V10. Indicated at 60 in FIG. 5B is an opening formed in a wall of the processing vessel 57 facing the operating space of the main carrying device 31A. A wafer W is carried into and carried out from the processing vessel 57 through the opening 60. The opening 60 is covered with a shutter 61.

Figure 6:
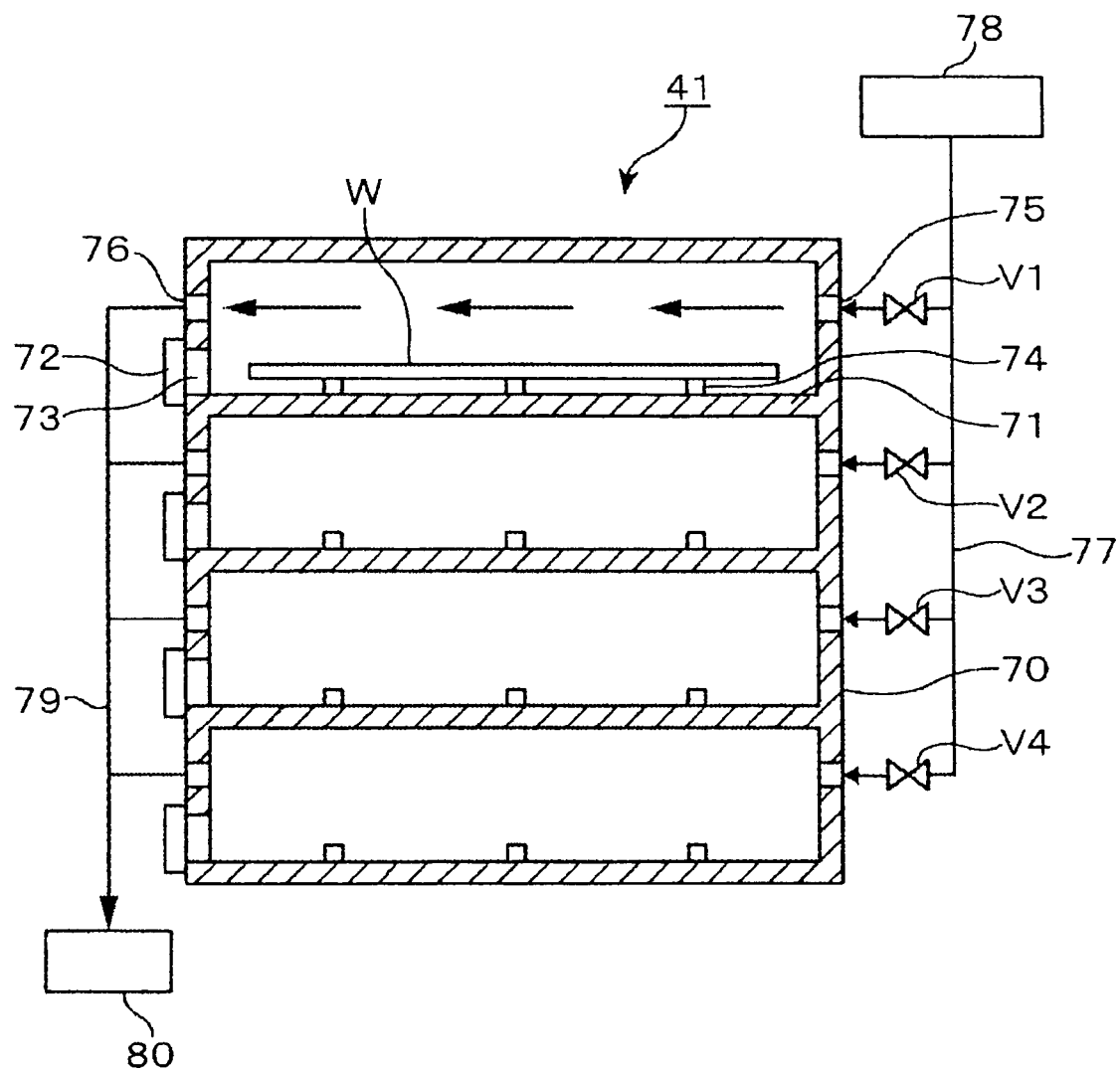
FIG. 6 is a schematic sectional view of a buffer unit installed in the interface block.

The construction of the buffer unit 41 will be briefly described with reference to FIG. 6. Indicated at 70 in FIG. 6 is a box provided with a plurality of stages 71, for example, four stages 71 disposed in a vertical arrangement. Wafers W are placed on the stages 17. The box 70 is divided into compartments respectively including the stages 71. Each of the compartments is provided with an opening 73 through which a wafer w is carried into and carried out of the compartments, and covered with a shutter 72. Three projections 74 for supporting a wafer W thereon are arranged on a circle on each of the stages 71. The projections 74 are disposed such that the projections 74 will not interfere with the arm 33 of the main carrying device 31A. A wafer W is transferred from the main carrying device 31A advanced through the opening 73, and is reversely transferred.

Gas supply ports 75 and gas discharge ports 76 are formed in the back wall and the front wall, respectively, of the box 70 so as to open into the compartments, respectively. The gas supply ports 75 are connected by a gas supply pipe 77 to a gas supply unit 78 for supplying a purge gas, such as air or nitrogen gas ($N_2$), into the box 70 for moisture and temperature regulation. The gas discharge ports 76 are connected by a gas discharge pipe 79 to a discharge device 80 for discharging the purge gas from the box 70. Indicated at V1 to V4 in FIG. 6 are valves.

The purge gas heated at a process temperature for the exposure system B4 is blown into the box in a direction from the back wall toward the front wall (leftward as viewed in FIG. 6) to keep the atmosphere in the box 70 at a temperature equal to the process temperature for the exposure system B4. A purge gas conditioned at a humidity, for example, between 60% and 80% by a humidifier, not shown, is supplied into the box 70 to avoid forming stains on the surface of a wafer W by making mist remaining on a cleaned wafer W dry gradually and to condition the surfaces of wafers nearly equally.

As shown in FIG. 4, the coating and developing system is provided with the controller 9 for controlling operations of the main carrying device 31A and the auxiliary carrying device 31B. The controller 9 carries out operations specified by instructions included in a first program 91 to make the auxiliary carrying device 31B carry a cleaned wafer W into the exposure system B4 so that a time interval between a wetting time point when the surface of a wafer W is wetted with the cleaning liquid and a delivery time point when the wafer W is delivered to the exposure system B4 may coincides with a set time interval (in this embodiment, may not be shorter than the set time interval). The first program 91 uses a time point when an instruction requesting opening the valve V10 placed in the supply line 62 shown in FIG. 5A is given as a wetting time point when the surface of a wafer w is wetted with the cleaning liquid. A timer included in the controller 9 is started at the wetting time point and a wafer W cleaned by the cleaning unit 40 is held temporarily by the buffer unit 41. The control program includes the steps of controlling the auxiliary carrying device 31B to deliver the wafer W from the buffer unit 41 to the reception stage 37 upon the termination of the time interval timed by the timer, i.e., upon the elapse of the time interval, before the reception of a ready signal, namely, a delivery request signal, from the exposure system B4 or to hold the wafer W in the buffer unit 41 until the end of the time interval if the time interval timed by the timer has not ended.

Figure 7:
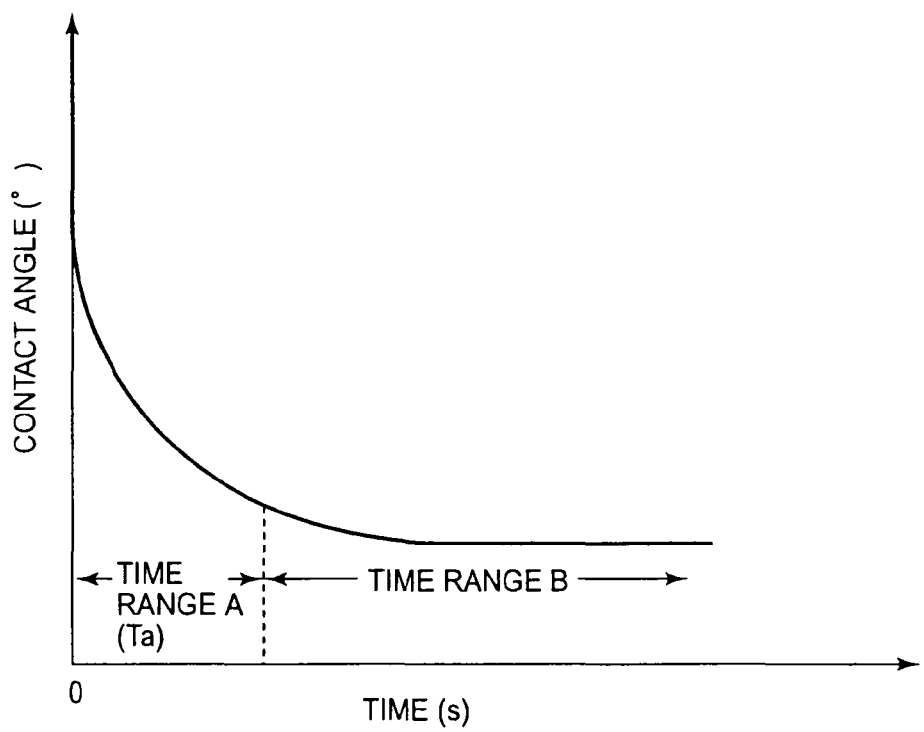
FIG. 7 is a graph of assistance in explaining the change of contact angle with time.

The set time interval will be explained. Referring to FIG. 7, the contact angle drops at a high contact angle drop rate in a time range A immediately after the surface of a wafer W has been wetted with the cleaning liquid by the cleaning unit 40. The contact angle drop rate decreases greatly after a time after the time range A and the contact angle remains substantially at a fixed level in a time range B. The time interval $T_a$ of the time range A is, for example, 50 s. The time interval $T_a$ is dependent on the quality of the protective film. A time point when the surface of the wafer W is wetted with the cleaning liquid is at the zero point of the graph shown in FIG. 7. The time interval $T_a$ is determined such that an immersion exposure starting point is in the time range B. Therefore, the end of the time interval $T_a$ may be at a time point in the time range B and near the end of the time range A (a time point near the boundary between the time ranges A and B). A short time from the start of carrying the wafer W from the buffer unit 41 through the reception stage 37 into the exposure system B4 to the start of the immersion exposure process may be taken into account in determining the time interval $T_a$ so that the immersion exposure process starts at a time point in the time range B. In the time range in which the level of the contact angle drop rate is far lower than that of the contact angle drop rate immediately after the surface of the substrate has been wetted with the cleaning liquid, the contact angle drop rate is not greater than one-third of the contact angle drop rate at which the contact angle decreases at the stage immediately after the surface of the wafer has been wetted with the cleaning liquid.

Figure 8:
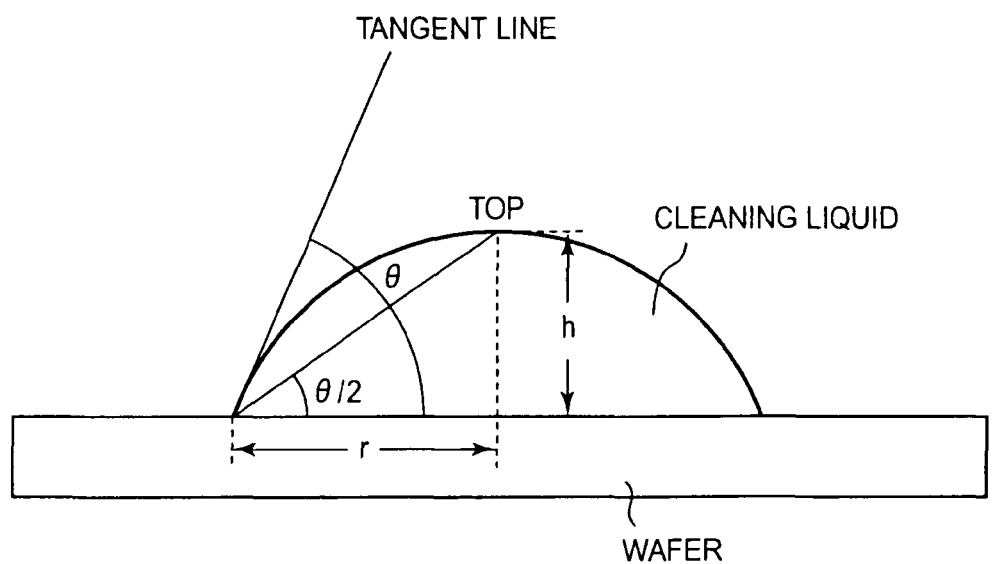
FIG. 8 is a view of assistance in explaining the mode of contact of a cleaning liquid with the surface of a wafer.
Figure 9:
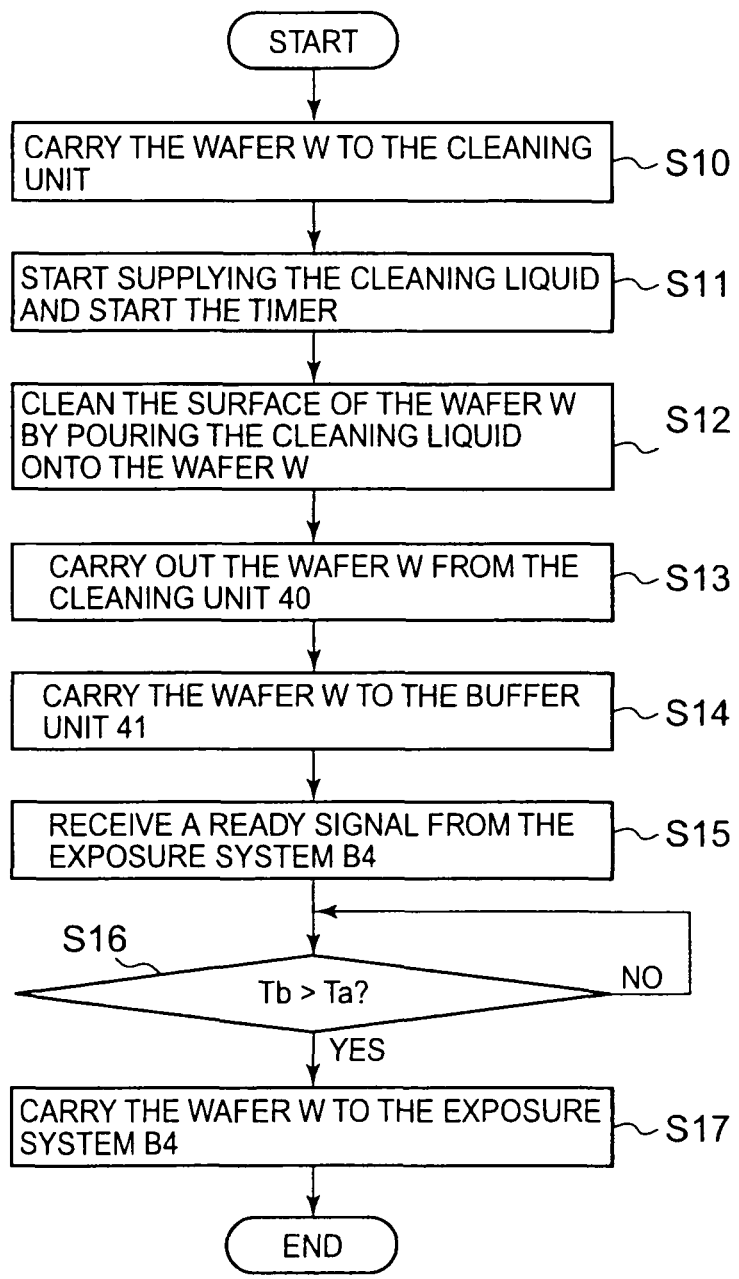
FIG. 9 is a flow chart of an operation to be carried out by the coating and developing system embodying the present invention.

FIG. 8 shows a cleaning liquid drop on a wafer W. The contact angle θ between the cleaning liquid drop dropped onto the surface of the wafer W and the surface of the wafer W is calculated by using: $\theta = 2\tan^{-1}(h/r)$, where h is the height of a cleaning liquid drop and r is the radius of the cleaning liquid drop. The contact angle changing from moment to moment is measured at time points to determine the change of the contact angle with time. A time interval between a time point when the surface of a wafer W is wetted with the cleaning liquid by the cleaning unit 40 and a time point when the buffer unit 41 receives a delivery request signal, namely, a ready signal, from the exposure system B4 after the buffer unit 41 has received the wafer W is a measuring time interval $T_b$. Protective films of different types have different degrees of permeability to the cleaning liquid, respectively. Therefore, the change of contact angle between the cleaning liquid and the surface of the protective film is indicated by different contact angle change curves like that shown in FIG. 7 for different types of protective films. Data on contact angle change curves for different types of protective films are obtained beforehand and the set time interval may be determine on the basis of the data on the contact angle change curve for the type of protective film formed on the surface of a wafer W.

The controller 9 carries out operations specified by a second program 92 to control the main carrying device 31A such that a time interval between the completion of processing a wafer W coated with a water-repellent protective film by the heating process (baking process) and a time point when the cleaning unit 40 starts the cleaning process for cleaning the wafer W is adjusted to a predetermined time interval. More concretely, the second control program 92 for controlling the main carrying device 31A includes the steps of starting a timer to measure time at a time point when the baking process is completed and the wafer W is separated from a heating plate, temporarily holding the wafer W processed by a peripheral exposure unit WEE to expose a peripheral part thereof by the buffer cassette SBU, and carrying the wafer W taken out of the buffer cassette SBU to the cleaning unit 40 upon the termination of the time interval timed by the time.

The first program 91 and the second program 92 are stored in a storage medium, such as a flexible disk (FD), a memory card, a compact disk (CD) or a magnetooptical disk (MO). The storage medium is installed in the controller 9, namely, a computer. In FIG. 4, indicated at 93 is a bus. A CPU 94 is connected to the bus 93.

The operation of the embodiment will be described. First, the flow of a wafer W in the coating and developing system will be briefly described. A carrier 2 containing wafers W is delivered from an external device to the carrier holding unit 20. Then, the opening 21 and the cover of the carrier 2 are opened and the transfer device A1 takes out a wafer W from the carrier 2. The wafer W is transferred through the transfer device, not shown, namely, one of the units of the shelf unit U1, to the main carrying device A2. The wafer W is processed by the devices of the shelf units U1 to U3 by pretreatment processes to be carried out before the coating process, such as a hydrophobicity imparting process and a cooling process. Then, the coating unit (COT) 30 forms a resist film on a surface of the wafer by spreading a liquid resist on the surface of the wafer W. Subsequently, the protective film forming unit (TC) forms a water-repellent protective film over the resist film. In some cases, the hydrophobicity imparting process is omitted and an antireflection film is formed on the surface of the wafer W by the antireflection film forming unit (BARC). In some cases, an antireflection film is formed over the resist film and the protective film is formed on the antireflection film. Then, the wafer W is subjected to a heating process (baking process) by a heating unit (PEB), namely, one of units of the shelf units U1 to U3. The wafer W is cooled and is carried through the transfer unit (TRS1) of the shelf unit U3 to the interface block B3. In the interface block B3, the main carrying device 31A carries the wafer W sequentially to the peripheral exposure unit (WEE), the buffer cassette (SBU) and the cleaning unit 40 in that order. Then, the auxiliary carrying device 31B carries the wafer W from the cleaning unit 40 sequentially to the buffer unit 41 and the exposure system B4 in that order. The exposure system B4 processes the wafer w by the immersion exposure process. The wafer W processed by the immersion exposure process is carried sequentially to the transfer unit (TRS2) and the heating unit (PEB) of the shelf unit U3 in that order by the main carrying device 31A and the auxiliary carrying device 31B. Then, the developing unit (DEV) of the processing unit U5 wets the resist film formed on the wafer W with a developer to develop the resist film. Thus a resist mask having a predetermined pattern is formed. Then, the transfer device A1 returns the wafer W to the carrier 2 held in the carrier holding unit 20.

When the wafer W is carried from the heating unit (PEB) to the cleaning unit 40, the wafer W is held temporarily in the buffer cassette (SUB) to adjust a time interval in which the wafer W is carried from the heating unit (PEB) to the cleaning unit 40 to the predetermined set time interval. A maximum time interval (the longest time interval expected by taking various cases in a control procedure into consideration) in which the wafer W is carried from the heating unit (PEB) to the buffer cassette (SBU) is set as a set time interval. If a time interval between a time point when the heating process for heating the wafer W by the heating unit (PEB) is completed and a time point when the arm 33 of the main carrying device 31A us retracted after delivering the wafer W to the buffer cassette (SBU) is equal to the set time interval, the arm 33 of the main carrying device A1 is stretched out, the wafer W is taken out from the buffer cassette (SBU) and the wafer W is carried to the cleaning unit 40. If the time interval is shorter than the set time interval, the wafer W is kept in the buffer cassette (SBU) until the set time interval ends, and then the wafer W is carried from the buffer cassette (SBU) to the cleaning unit 40. Thus the time interval between the completion of the heating process and the start of the cleaning process is adjusted to the set time interval.

A carrying procedure for carrying the wafer W from the cleaning unit 40 to the exposure system B4 will be described. First, the wafer W is carried from the buffer cassette (SBU) to the cleaning unit 40 by the main carrying device 31A in step S10. The arm 33 of the main carrying device 31A carries the wafer W through the opening 60 into the processing vessel 57 and transfers the wafer W to the spin chuck 50. Then, in step S11, the valve V10 is opened to start pouring the cleaning liquid through the cleaning liquid pouring nozzle 55 onto a central part of the wafer W and, at the same time, the timer included in the controller 9 is started when an instruction requesting opening the valve V10 is given. Then, in step S12, the spin chuck 50 is rotated to spread the cleaning liquid radially over the surface of the wafer W by centrifugal force to clean the surface of the protective film formed on the surface of the wafer W entirely. After the surface of the protective film has been cleaned, the wafer W is rotated for spin drying that shakes cleaning liquid off the wafer W. Subsequently, the arm 36 of the auxiliary carrying device 31B advances through the opening 64 into the processing vessel 57 and receives the wafer W from the spin chuck 50 in step S13. Then, in step S14, the wafer W is carried to the buffer unit 41.

Then, the shutter 72 is closed to close the opening 64, the purge gas is supplied into the box 70 to adjust the temperature and humidity of the atmosphere in the box 70 for the control of the quality of the protective film of the wafer W.

Figure 10:
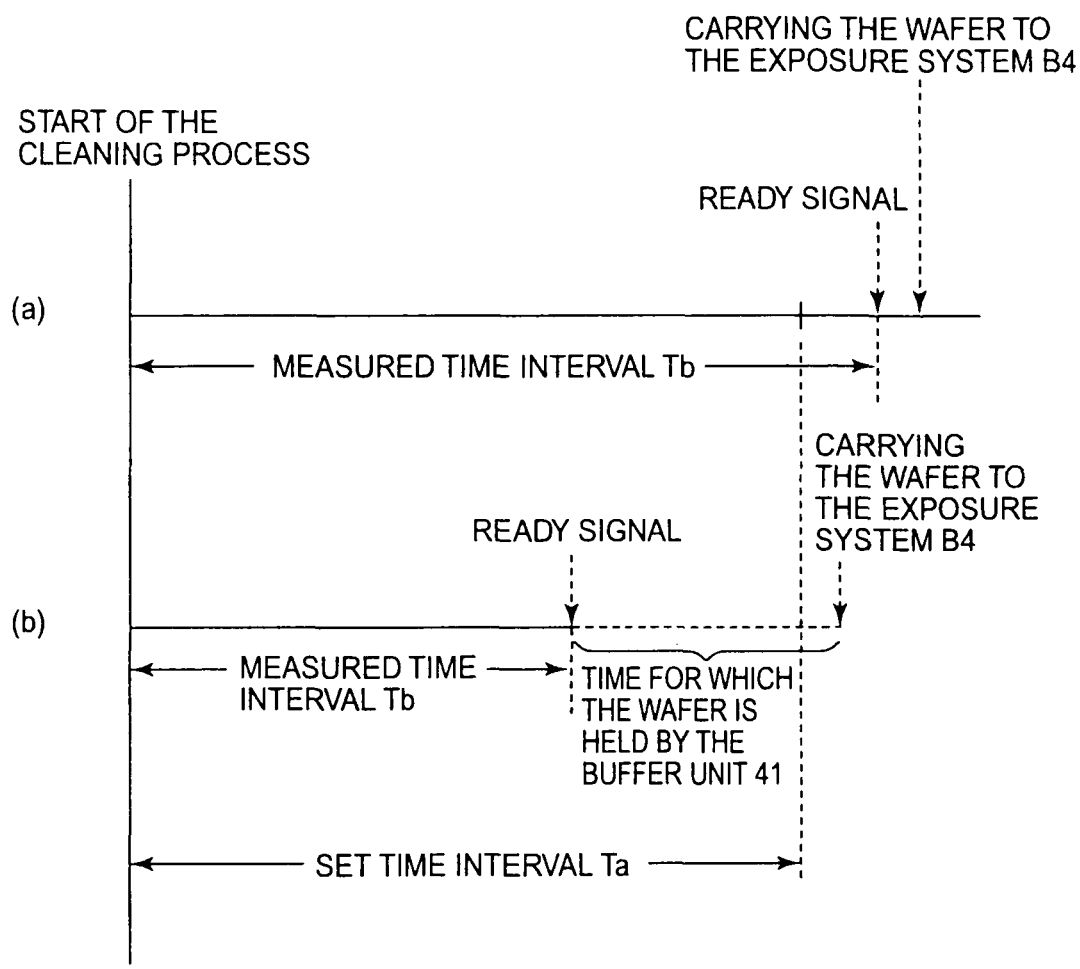
FIG. 10 is a diagram of assistance in explaining the operation of the coating and developing system embodying the present invention.

When a delivery request signal, namely, a ready signal, is given to the controller 9 by the exposure system B4 in step S15, the controller 9 makes a query in step S16 to see whether or not the set time interval timed by the timer ended before the delivery request signal (ready signal) is received from the exposure system B4. If the response to the query in step S16 is affirmative, i.e., if a measured time interval $T_b$ from the start of wetting the wafer W with the cleaning liquid is longer than the set time interval $T_a$ ($T_b$>$T_a$), the controller 9 instructs the auxiliary carrying device 31B to take out the wafer W from the buffer unit 41 and to carry the wafer W to the reception stage 37 of the exposure system B4, and the auxiliary carrying device 31B operates accordingly (FIG. 10(b)).

Figure 11:
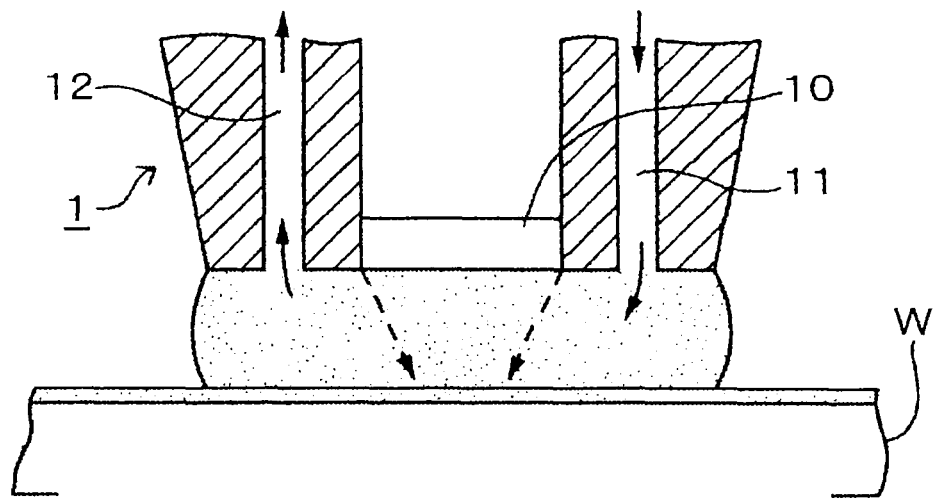
FIG. 11 is a schematic sectional view of assistance in explaining an exposure means for processing a wafer by an immersion exposure process.
Figure 12:
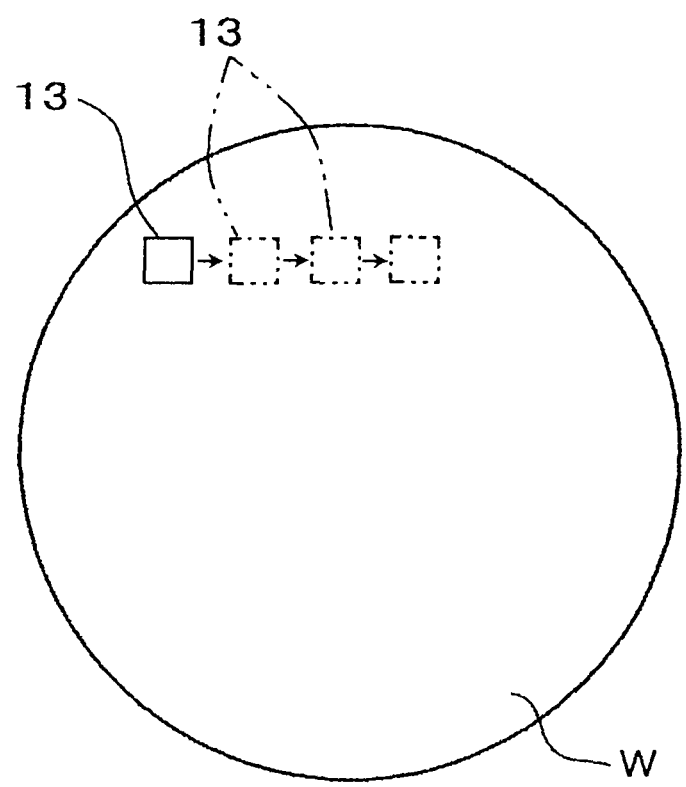
FIG. 12 is a plan view of assistance in explaining processing the surface of a wafer by an immersion exposure process by the exposure means.

The exposure system B4 forms a liquid film on the surface of the wafer W and irradiates the wafer W with light through the liquid film in a manner mentioned in the description of the related art in connection with FIGS. 11 and 12 to transfer a predetermined circuit pattern sequentially to shot areas on the wafer in step S17.

The controller 9 of the coating and developing system embodying the present invention carries out the control program 91 to manage the time interval between the cleaning of the water-repellent film formed on the surface of the wafer W by the cleaning unit 40 and the start of the immersion exposure process by the exposure system B4 by holding the wafer W by the buffer unit 41. Therefore, the contact angle between the surface of the wafer W and the liquid forming the liquid film for immersion exposure is at a level in the time range B shown in FIG. 7 even though different wafers W are held for different times, respectively, between the completion of cleaning and the start of immersion exposure. Accordingly, the degrees of permeability of the water-repellent protective films formed respectively on different wafers W are nearly equal to each other and hence the degrees of change in property of the surfaces of wafers W are approximately equal to each other. Consequently, the difference in the line width of patterns among different wafers is small, which contributes to suppressing the variation of the line width of the pattern.

The controller 9 carries out operations specified by the second program 92 to hold the wafer W by the buffer cassette (SBU) such that a time interval between the completion of processing the wafer W coated with the chemical solution for forming the protective film by the heating process and a time point when the cleaning unit 40 starts the cleaning process for cleaning the wafer W before subjecting the wafer W to the immersion exposure process is adjusted to a predetermined time interval. Therefore, wafers W are the same in the amount of moisture absorbed from the environmental atmosphere, namely, moisture content, and hence difference in the property of the surface of the wafer W due to difference in moisture content among the substrates can be reduced.

Although the foregoing embodiment cleans a wafer W coated with the water-repellent protective film, the foregoing embodiment may be applied to cleaning a wafer W coated with a water-repellent resist film.

Although the main carrying device 31A carries a wafer W to the cleaning unit 40 in the foregoing embodiment, a wafer processed by the peripheral exposure process may be transferred through the transfer unit (TRS2) to the auxiliary carrying device 31B and the wafer W may be carried to the cleaning unit 40 by the auxiliary carrying device 31B. Although the single cleaning unit 40 is installed in the second carrying chamber 28b of the interface block B3 of the foregoing embodiment, a plurality of cleaning units 40 similar to the cleaning unit 40 described with reference to FIGS. 5A and 5B may be stacked in a plurality of layers in the second carrying chamber 28b.

The invention claimed is:

1. A coating and developing method for coating a surface of a substrate with a resist film by applying a liquid resist to the surface of the substrate and forming a water-repellent protective film on the resist film, or
    forming a water-repellent resist film on the substrate,
    and processing the substrate by a developing process after the substrate has been processed by an immersion exposure process,
    said coating and developing method comprising the steps of:
    forming a resist film on a surface of a substrate;
    cleaning the surface of the substrate with a cleaning liquid by a cleaning unit;
    carrying the cleaned substrate to an exposure system by a carrying means to process the substrate by an immersion exposure process; and
    controlling the carrying means to adjust a time interval between a wetting time point when the surface of the substrate is wetted with the cleaning liquid and a delivery time point when the substrate is delivered to an exposure system to a first set time interval;
    wherein the first set time interval is determined beforehand such that the substrate is subjected to the immersion exposure process after contact angle drop rate at which contact angle between the surface of the substrate and the cleaning liquid decreases has dropped from an initial level at a wetting time point when the surface of the substrate is wetted with the cleaning liquid to a level far lower than the initial level and the contact angle has dropped to substantially a fixed level.

2. The coating and developing method according to claim 1, wherein the time interval between the wetting time point when the surface of the substrate is wetted with the cleaning liquid and the delivery time point when the carrying means delivers the substrate to the exposure system is adjusted to the first set time interval by a buffer unit disposed in a carrying passage between the cleaning unit and the exposure system.

3. The coating and developing system according to claim 1, wherein the step of controlling the carrying means controls the carrying means so as to carry the substrate immediately to the exposure system when a time for which the substrate has been held after wetting the substrate with the cleaning liquid is longer than the first set time interval at the reception of a substrate delivery command from the exposure system or so as to hold the substrate in the buffer unit when a time for which the substrate has been held after wetting the substrate with the cleaning liquid is shorter than the first set time interval at the reception of a substrate delivery command from the exposure system.

4. The coating and developing method according to claim 1 further comprising the step of forming a water-repellent protective film for protecting the surface of the substrate during immersion exposure on the resist film by applying a chemical solution to the resist film by a protective film forming unit;
    wherein the step of cleaning the surface of the substrate cleans a surface of the water-repellent protective film by the cleaning unit.

5. The coating and developing method according to claim 4 further comprising the steps of:
    processing the substrate coated with the chemical solution by the protective film forming unit by a heating process;
    carrying the substrate processed by the heating process to the cleaning unit; and
adjusting a time interval between the completion of heating the substrate by the heating process and the start of a cleaning operation of the cleaning unit to a second set time interval.

6. The coating and developing method according to claim 1 further comprising the steps of:
    heating the substrate coated with the liquid resist by a heating process by a heating unit;
    carrying the substrate processed by the heating process by the heating unit to the cleaning unit; and
    adjusting a time interval between the completion of heating the substrate by the heating process and the start of a cleaning operation of the cleaning unit to a second set time interval.

7. The coating and developing method according to claim 5 further comprising the step of adjusting a time interval between the completion of heating the substrate by the heating process and the start of cleaning the substrate by the cleaning unit to a set time interval by holding the substrate by a buffer cassette disposed in a carrying passage between a heating unit and the cleaning unit.

8. The coating and developing method according to claim 1, wherein the contact angle drop rate in the time range in which the contact angle is at the level far lower than the initial level immediately after the surface of the substrate has been wetted with the cleaning liquid is not higher than one-third of the contact angle drop rate at which the contact angle drops immediately after the surface of the substrate has been wetted with the cleaning liquid.

* * * * *